United States Patent [19]
Chan et al.

[11] Patent Number: 5,196,909
[45] Date of Patent: Mar. 23, 1993

[54] CAPACITOR FOR DRAM CELL

[75] Inventors: Tsiu C. Chan, Carrollton; Frank R. Bryant, Denton, both of Tex.

[73] Assignee: SGS-Thomson Microelectronics, Inc., Carrollton, Tex.

[21] Appl. No.: 697,227

[22] Filed: May 7, 1991

Related U.S. Application Data

[62] Division of Ser. No. 443,897, Nov. 30, 1989, Pat. No. 5,116,776.

[51] Int. Cl.⁵ .......................................... H01L 29/68
[52] U.S. Cl. ................................... 257/296; 257/528; 257/538
[58] Field of Search ................... 357/23.6, 23.6 G, 51, 357/59 J

[56] References Cited
U.S. PATENT DOCUMENTS

| | | | |
|---|---|---|---|
| 4,899,203 | 2/1990 | Ino | 357/23.6 |
| 4,922,312 | 5/1990 | Coleman et al. | 357/23.6 |
| 4,949,154 | 8/1990 | Haken | 357/23.6 |
| 4,953,126 | 8/1990 | Ema | 357/23.6 |
| 5,006,481 | 4/1991 | Chan et al. | 357/23.6 |

*Primary Examiner*—Andrew J. James
*Assistant Examiner*—Courtney A. Bowers
*Attorney, Agent, or Firm*—Kenneth C. Hill; Lisa K. Jorgenson; Richard K. Robinson

[57] ABSTRACT

A capacitor suitable for use with a DRAM memory cell is composed of multiple layers of polycrystalline silicon. The storage node is formed from a polycrystalline silicon layer sandwiched between two polysilicon ground plate layers. Such a structure nearly doubles the capacitance for a given chip surface area used. First the bottom polycrystalline silicon plate layer is fabricated, followed by an isolation step and fabrication of the storage node polycrystalline silicon layer. Following another isolation step, the polycrystalline silicon top plate layer is then formed and connected to the bottom plate layer.

7 Claims, 3 Drawing Sheets

CAPACITOR FOR DRAM CELL

This is a division of application Ser. No. 07/443,897, filed Nov. 30, 1989, U.S. Pat. No. 5,116,776.

BACKGROUND OF THE INVENTION

1. Field of the Invention:

The present invention relates generally to integrated circuit memories, and more specifically to memory cells for dynamic random access memory devices.

2. Description of the Prior Art:

Dynamic random access memory (DRAMs) are widely used in the electronic industry. DRAM memory cells typically use a field effect transistor as a pass gate, and a capacitor as a storage node. The current state of the DRAM cell is represented by the presence or absence of charge on the storage node. The quality of a DRAM cell is strongly effected by the size of the capacitor. A smaller capacitance for the storage node results in lower signal-to-noise ratios since a smaller charge can be stored on the capacitor. Smaller capacitors also require shorter refresh times for the DRAM cells.

As memory capacities increase, the density of memory cells on an integrated circuit increases and each cell must be made smaller. As cell sizes shrink, problems with small capacitors become more difficult to deal with during cell design. Efforts have been made to improve the capacitance of the storage node by increasing the capacitor plate surface area using a number of techniques. These include the placement of transistors in relatively deep trenches, or pits, excavated from the substrate, and placing capacitors on the sides of vertical pillars. The processing technologies used to fabricated such structures are relatively difficult to control, resulting in a large variability in device properties. In addition, they tend to increase the complexity of the process flow, adding to device cost.

It would be desirable to provide a capacitor suitable for DRAM cells which has an increased capacitance. It would be further desirable to provide such a capacitor which does not greatly increase the overall cell size and which does not add greatly to the complexity of integrated circuit processing.

SUMMARY OF THE INVENTION

It is therefore an object of the present invention to provide a capacitor suitable for use with DRAM cells which has an increased capacitor.

It is a further of the present invention to provide such a capacitor which provides an increased capacitor plate area without increasing the layout area for a DRAM cell.

It is another object of the present invention to provide such a capacitor which uses relatively simple and repeatable process steps, and which is compatible with current N-channel DRAM process flows.

It is yet another object of the present invention to provide such a capacitor which can be fabricated without greatly increasing process complexity and cost.

Therefore, according to the present invention, a capacitor suitable for use with a DRAM memory cell is composed of multiple layers of polycrystalline silicon. The storage node is formed from a polycrystalline silicon layer sandwiched between two polysilicon ground plate layers. Such a structure nearly doubles the capacitance for a given chip surface area used. First the bottom polycrystalline silicon plate layer is fabricated, followed by an isolation step and fabrication of the storage node polycrystalline silicon layer. Following another isolation step, the polycrystalline silicon top plate layer is then formed and connected to the bottom plate layer.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
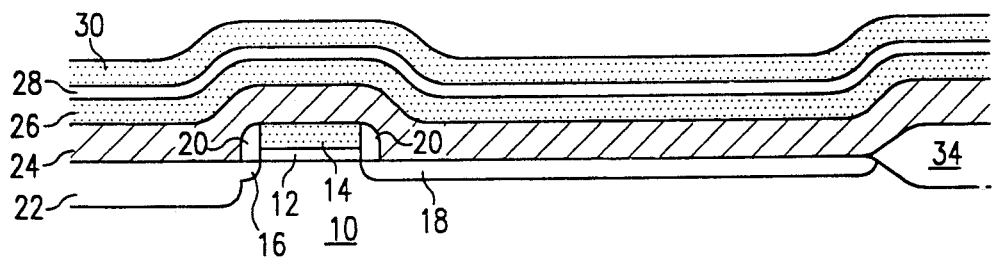
FIGS. 1–7 illustrate a preferred process flow for fabricating a capacitor according to the present invention.

Referring to FIG. 1, a process is shown for fabricating a capacitor according to the present invention for utilization with N-channel DRAM cells. A DRAM cell is fabricated in a P-type substrate 10. As known in the art, a field effect transistor pass gate is formed by forming a thin gate oxide layer 12 followed by a gate polycrystalline silicon layer 14. Polycrystalline silicon layer 14 may include a silicide layer, such as titanium or tantalum disilicide, to improve conductivity as known in the art. The pass gates, comprising polycrystalline silicon layer 14 and gate oxide layer 12, are then patterned, followed by a lightly-doped drain (LDD) implant to form LDD regions 16, 18. Sidewall oxide spacer regions 20 are then formed, followed by a heavy implant to form an active source/drain region 22. To this point, processing has followed the usual steps known in the art.

Next, a dielectric layer 24, preferably a low temperature oxide deposited to a depth of approximately 2,000 Å, is deposited over the surface of the chip. This is followed by a second layer of polycrystalline silicon 26, preferably deposited to a depth of approximately 1,500 Å, which is then doped N-type by implant. A thin dielectric layer 28 is then formed over the surface of the chip.

Layer 28 is preferably an oxide-nitride-oxide layer as known in the art. Other dielectric layers, such as nitride-oxide, may be used if desired. This layer may be formed by growing an oxide layer on the polycrystalline silicon layer 26, followed by deposition of a thin nitride layer. Further oxidation of the nitride layer forms an upper oxide layer, giving the desired oxide-nitride-oxide sandwich. This form of dielectric is preferred because it allows a thinner dielectric to be formed, and has a higher dielectric constant than oxide alone. Also, the oxide-nitride-oxide dielectric has a lower pinhole density than a thin oxide alone.

After formation of dielectric layer 28, another polycrystalline silicon layer 30 is deposited over the surface of the chip. This layer 30 is used as a buffer layer, and will be partially incorporated into the storage node of the cell capacitor.

Figure 2:
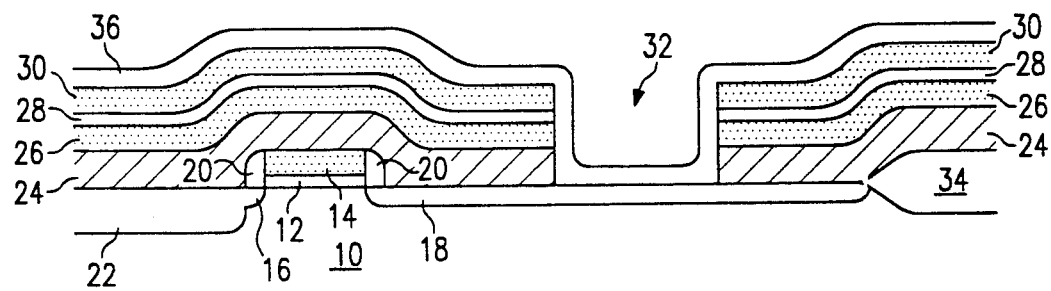

Referring to FIG. 2, the next step is to pattern and etch a contact opening 32. This opening is located near the pass gate 14, and is shown in FIG. 2 as being located approximately half way between such feature and field oxide region 34. Contact opening 32 is formed by an anisotropic etch through all of the layers 30, 28, 26, 24 to open up region 18 within the substrate 10.

Figure 3:
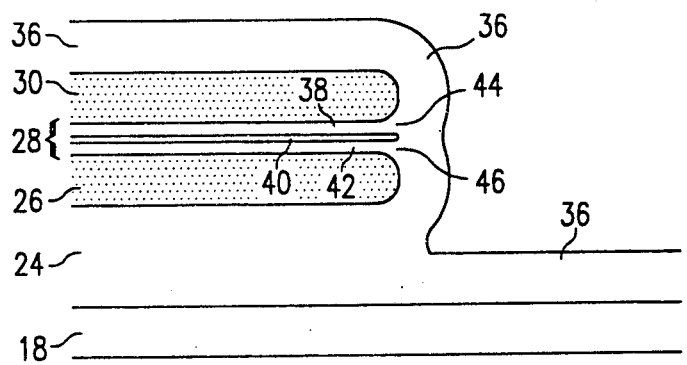

Next, the chip is oxidized to grow an oxide layer 36 on all exposed surfaces. FIG. 3 shows details of the oxide layer 36 as grown along one sidewall of contact opening 32. Insulating layer 28 is comprised of oxide layer 36, nitride layer 40, and oxide layer 42. As shown in FIG. 3, formation of oxide layer 36 results in formation of a small bird's beak 44 between polycrystalline silicon layer 30 and nitride layer 40, and another bird's beak between nitride layer 40 and polycrystalline silicon layer 26. The effect of these bird's beaks 44, 46 is to separate the polycrystalline layers 26, 30 at their edges, where electric fields are generally most intense.

If the high temperature oxide growth step is not desired, a lower temperature CVD oxide can be grown instead. Although the bird's beak formations are not grown, an adequate insulative layer is still provided.

Figure 4:
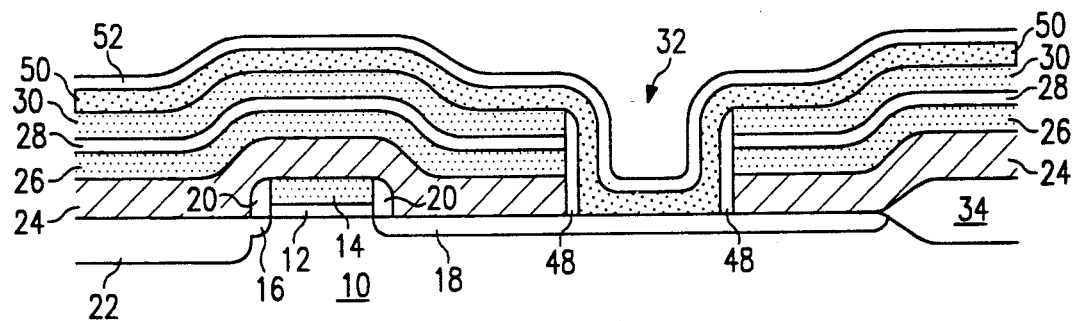

Referring to FIG. 4, the oxide layer 36 is anisotropically etched to form sidewall dielectric regions 48 along the sides of contact opening 32. This etch removes all of the oxide layer 36 from over polycrystalline silicon buffer layer 30. A third polycrystalline silicon layer 50 is then grown over the surface of the chip, making contact with active region 18 within the contact opening 32. Third polycrystalline silicon layer 50 and buffer layer 30 are now the same layer functionally. A partial dielectric layer 52 is then formed over the surface of the chip. Layer 52 consists of a thin grown oxide layer, followed by a deposited nitride layer. These are the first two layers of an oxide-nitride-oxide dielectric sandwich formed as illustrated in FIG. 3, but the upper oxide layer is not yet formed.

Figure 5:
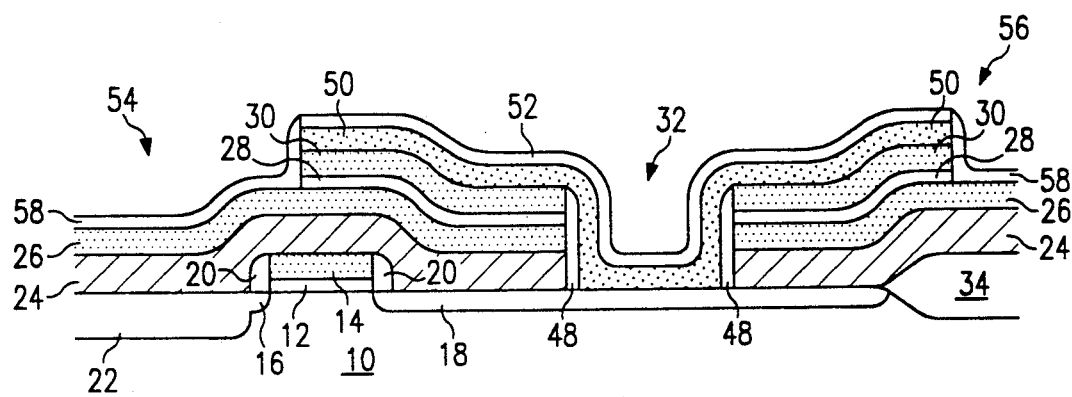

Referring to FIG. 5, the chip is then patterned and etched to define the charged storage plate of the capacitor. Regions 54 and 56 are etched down to polycrystalline silicon layer 26 using an anisotropic etch. Region 54 will be used later to make contact with the active region 22. Following the etch, an oxidation step is performed which converts layer 52 into an oxide-nitride-oxide dielectric, and grows an oxide layer 58 over the remaining surfaces of the chip. This includes a growth of oxide on the sidewalls of etched regions 54 and 56. The sidewalls of such regions are very similar to the sidewall regions shown in FIG. 3, with small bird's beaks being formed on either side of the middle nitride layer in dielectric sandwich layers 28 and 52. As described in connection with FIG. 3, a CVD oxide can be deposited instead of growing a thermal oxide.

Figure 6:
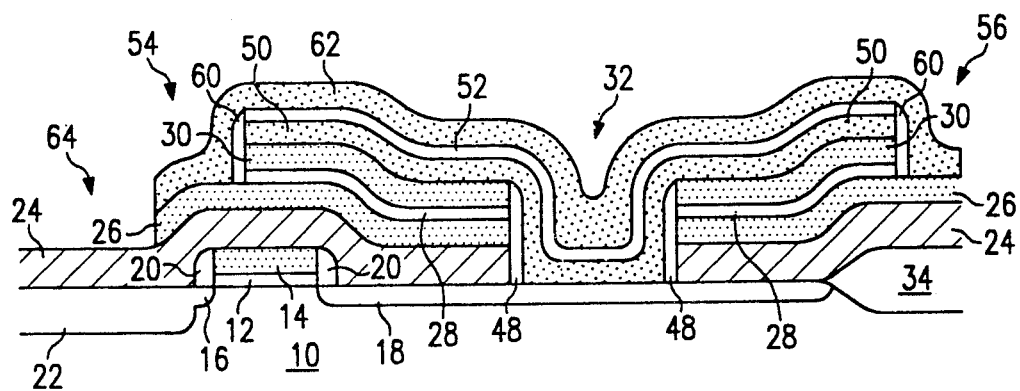

Referring to FIG. 6, the newly grown oxide layer is anisotropically etched to form sidewall dielectric regions 60 along side openings 54 and 56. These dielectric regions 60, as described above, are similar to sidewall regions 48 within contact opening 32. In the alternative, a mask can be used to define openings in the oxide layer 58 to allow contact to be made with polycrystalline layer 26. A fourth layer of polycrystalline silicon 62 is grown over the surface of the chip, and doped N-type. Layer 62 makes contact with layer 26. Region 64 is then anisotropically etched, using a mask, through polcrystalline silicon layers 62 and 26, to expose oxide layer 24. A corresponding etch region (not shown) is made just beyond the right edge of the drawing of FIG. 6.

At this point, the capacitor has been entirely defined. Polycrystalline silicon layer 26 defines the bottom ground plate of the capacitor, and polycrystalline silicon layer 62 defines the top ground plate of the capacitor. The charge storage plate of the capacitor is formed by polycrystalline silicon layers 30 and 50, and makes contact with active region 18. The charge storage plate is completely separated from the upper and lower capacitor ground plates by dielectric regions 52 and 28, and sidewall regions 48 and 60, and is in contact with layer 18.

Figure 7:
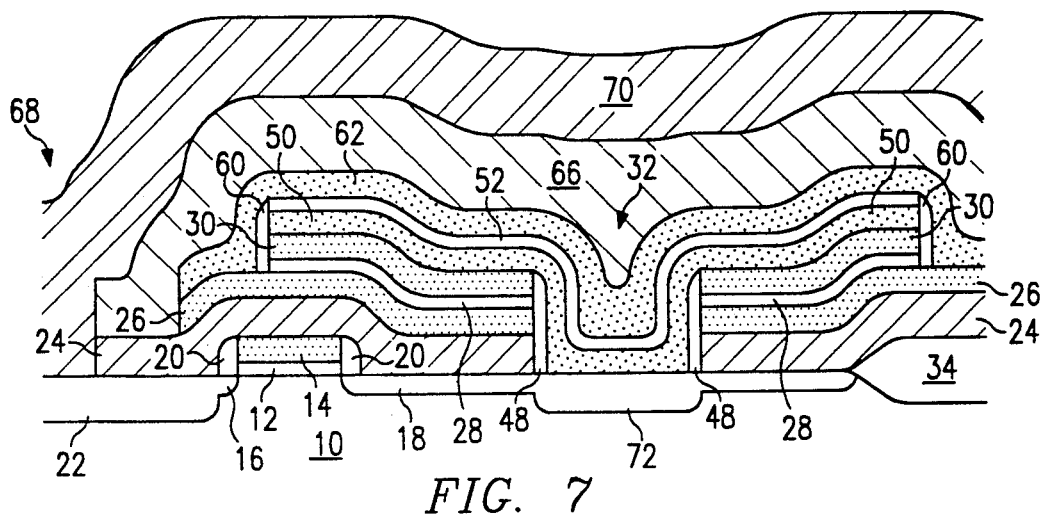

Referring to FIG. 7, after definition of the capacitor a dielectric layer 66 is formed over the surface of the chip. This dielectric layer 66 is preferably a reflow glass, such as PSG or BPSG. Contact opening 68 is then formed through glass layer 66 and oxide layer 24 to make contact with active region 22. Metal layer 70 is then deposited and patterned on the surface of the chip. As known in the art, deposition of metal layer 70 can include an aluminum layer with one or more refractory metal layers.

High temperature oxide growth and deposition steps cause a diffusion of the N-type impurity from polycrystalline silicon layer 50 into the active region 18. Since region 18 and diffused region 72 are both N-type, no shorting or undesired junctions are formed in this area.

Figure 8:
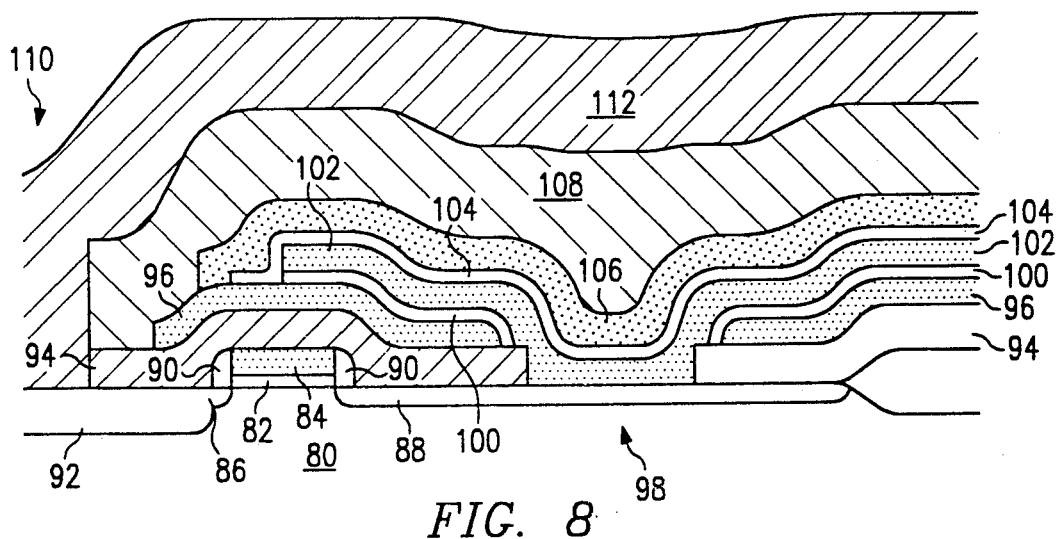
FIG. 8 is a cross-sectional diagram of an alternative embodiment of a capacitor according to the present invention.

Referring to FIG. 8, an alternative structure utilizing a capacitor according to the present invention is shown. This alternative structure is not a self-aligned process as was the case with the previously described method. As was the case with FIG. 1, the device is formed in P-type substrate 80. Formation of the gate oxide 82 gate polycrystalline silicon 84, LDD regions 86 and 88, sidewall spacers 90, and active region 92 are formed as known in the art.

An oxide insulator region 94 is formed over the surface of the chip, followed by second level polycrystalline silicon layer 96. Contact opening 98 is then formed by patterning and etching polycrystalline silicon layer 96, followed by deposition of an oxide-nitride-oxide dielectric layer 100. Oxide layer 94 is then masked and etched to form a smaller opening than was made through polycrystalline silicon layer 96, completing formation of contact opening 98.

Polycrystalline silicon layer 102 is then deposited over the surface of the chip, and patterned to form the charge storage plate of the capacitor. This polycrystalline silicon layer 102 makes contact with the active region 88. The etch of polycrystalline silicon layer 102 also etches away the underlying dielectric layer 100.

A second oxide-nitride-oxide dielectric layer 104 is then formed over the surface of the chip to isolate the charge storage plate 102, and patterned to expose portions of polycrystalline layer 96. A fourth polycrystalline silicon layer is then deposited and patterned so as to make contact with the underlying second level polycrystalline silicon layer 96. Polycrystalline silicon layers 96 and 106 form the top and bottom ground plates of the capacitor, with polycrystalline silicon layer 102 forming the charge storage node. Dielectric layer 108, preferably a reflow glass, is formed over the surface of the chip, and patterned to form contact openings 110. The formation of contact openings 110 also etch away any remaining portions of the underlying oxide layer 94. Metal interconnect layer 112 is then formed and patterned as known in the art.

The process flow for the alternative method shown in FIG. 8 is somewhat simpler than that of FIG. 1-7, but requires more masking steps. With very small geometry devices, the self-aligned techniques are generally preferred since less area must be used to take mask registration error into account.

Using the methods described above, a capacitor has been formed which has ground plates above and below a charge storage capacitor plate. This approximately doubles the capacitance of the charge storage node without increasing the overall area of the DRAM cell. Although multiple polycrystalline silicon layers are formed, no complex processing steps, such as thin film deposition on the sidewalls of a trench or pillar, are required.

In addition to increasing the capacitance of the DRAM cell without increasing its area, the charge storage node is surrounded by upper and lower capacitor plates. These upper and lower capacitor plates are grounded, which provides improved electrical isolation for the charge storage node. The DRAM cell is thus less vulnerable to being influenced by changing signals on the word and bit lines of the device.

While the invention has been particularly shown and described with references to a preferred embodiment, it will be understood by those skilled in the art that various changes in form and detail may be made therein without departing from the spirit and scope of the invention.

What is claimed is:

1. A semiconductor integrated circuit device structure, comprising:
    a substrate;
    an interlevel dielectric layer overlying said substrate;
    a lower polycrystalline silicon capacitor plate overlying said interlevel dielectric layer;
    a first insulating layer overlying said lower polycrystalline silicon capacitor plate;
    a buffer polycrystalline silicon layer overlying a portion of said first insulating layer;
    an opening extending through said interlevel dielectric layer, said lower polycrystalline silicon capacitor plate, said first insulating layer, and said buffer polycrystalline silicon layer to expose a portion of said substrate;
    a charge storage polycrystalline silicon capacitor plate overlying said buffer polycrystalline silicon layer and extending through said opening to contact said substrate;
    dielectric sidewall spacers alongside sidewalls of said opening, wherein said charge storage polycrystalline silicon capacitor plate within said opening is separated from said lower polycrystalline silicon capacitor plate and said buffer polycrystalline layer by said dielectric sidewall spacers;
    a second insulating layer overlying said charge storage polycrystalline silicon capacitor plate and sidewalls of said charge storage plate and said buffer layer; and
    an upper polycrystalline silicon capacitor plate overlying said second insulating layer and separated from said charge storage polycrystalline silicon capacitor plate thereby, wherein said upper capacitor plate is physically connected to said lower capacitor plate adjacent to the charge storage plate and buffer layer sidewalls.

2. The device structure of claim 1, wherein said charge storage polycrystalline silicon capacitor plate is a charge storage node of a DRAM memory cell.

3. The device structure of claim 1, wherein said first insulating layer comprises:
    a first oxide layer;
    a nitride layer overlying said first oxide layer; and
    a second oxide layer overlying said nitride layer.

4. The device structure of claim 1, wherein said second insulating layer comprises:
    a first oxide layer;
    a nitride layer overlying said first oxide layer; and
    a second oxide layer overlying said nitride layer.

5. The device structure of claim 1, wherein said upper polycrystalline silicon capacitor plate and said lower polycrystalline silicon capacitor plate are in physical contact throughout their expanse, except where separated by said buffer layer and said charge storage plate.

6. A DRAM memory cell, comprising:
    a substrate;
    a pass gate overlying said substrate;
    a first interlevel dielectric layer overlying said substrate and said pass gate;
    a lower polycrystalline silicon capacitor plate overlying said first interlevel dielectric layer;
    a first insulating layer in overlying contact with said lower capacitor plate;
    a buffer polycrystalline silicon layer in overlying contact with a portion of said first insulating layer, and extending over said pass gate; a first opening extending through said first interlevel dielectric layer, said lower capacitor plate, said first insulating layer, and said buffer layer to expose a portion of said substrate adjacent said pass gate;
    a charge storage polycrystalline silicon capacitor plate in overlying contact with said buffer layer and extending through said first opening to contact said substrate;
    a second insulating layer in overlying contact with said charge storage polycrystalline silicon capacitor plate and sidewalls of said charge storage plate and said buffer layer; and
    an upper polycrystalline silicon capacitor plate in overlying contact with said second insulating layer and separated from said charge storage polycrystalline silicon capacitor plate thereby, wherein said upper capacitor plate is physically connected to said lower capacitor plate adjacent to the charge storage plate and buffer layer sidewalls.

7. The DRAM memory cell of claim 6, further comprising:
    a second interlevel dielectric layer overlying said upper capacitor plate;
    a second opening extending through said second interlevel dielectric layer, said upper and lower capacitor plates, and said first interval dielectric layer to contact said substrate at a location separated from said first opening by said pass gate; and
    a conductive bit line overlying a portion of said second interlevel dielectric layer and extending through said second opening to contact said substrate.

* * * * *